United States Patent
Kobayashi

(10) Patent No.: US 10,257,446 B2
(45) Date of Patent: Apr. 9, 2019

(54) SOLID-STATE IMAGING DEVICE

(71) Applicant: OLYMPUS CORPORATION, Hachioji-shi, Tokyo (JP)

(72) Inventor: Kenji Kobayashi, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/709,988

(22) Filed: Sep. 20, 2017

(65) Prior Publication Data

US 2018/0013966 A1 Jan. 11, 2018

Related U.S. Application Data

(63) Continuation of application No. PCT/JP2015/059087, filed on Mar. 25, 2015.

(51) Int. Cl.
*H04N 5/341* (2011.01)
*H04N 5/351* (2011.01)
(Continued)

(52) U.S. Cl.
CPC .............. *H04N 5/341* (2013.01); *H04N 5/351* (2013.01); *H04N 5/374* (2013.01); *H04N 5/379* (2018.08);
(Continued)

(58) Field of Classification Search
CPC .... H04N 5/341; H04N 5/351; H04N 5/37452; H04N 5/37457; H04N 5/23245;
(Continued)

(56) References Cited

U.S. PATENT DOCUMENTS 8,854,517 B2 * 10/2014 Honda .............. H01L 27/14634
348/308
2013/0182161 A1 7/2013 Nakajima
2014/0240566 A1 8/2014 Shizukuishi

FOREIGN PATENT DOCUMENTS

JP 2012-257095 A 12/2012
JP 2013-90127 A 5/2013
(Continued)

OTHER PUBLICATIONS

International Search Report dated Jun. 2, 2015, issued in counterpart application No. PCT/JP2015/059087, w/English translation. (4 pages).

*Primary Examiner* — Yogesh K Aggarwal
(74) *Attorney, Agent, or Firm* — Westerman, Hattori, Daniels & Adrian, LLP

(57) ABSTRACT

In a solid-state imaging device, a first substrate has a plurality of pixels and a plurality of first control signal lines. The plurality of first control signal lines are connected to pixels of each row. The second substrate includes a plurality of second control signal lines and a control circuit. The arrangement of each of the plurality of second control signal lines on the second substrate corresponds to the arrangement of a corresponding one of the plurality of first control signal lines on the first substrate. The connection portion has a plurality of control connections and a plurality of readout connections. Each of the plurality of control connections is connected to one of the plurality of first control signal lines and a corresponding one of the plurality of second control signal lines.

4 Claims, 10 Drawing Sheets

(51) Int. Cl.
*H04N 5/3745* (2011.01)
*H04N 5/374* (2011.01)
*H04N 5/369* (2011.01)
*H04N 5/232* (2006.01)
*H01L 27/146* (2006.01)

(52) U.S. Cl.
CPC ....... *H04N 5/3742* (2013.01); *H04N 5/37452* (2013.01); *H01L 27/14634* (2013.01); *H01L 27/14641* (2013.01); *H04N 5/23245* (2013.01); *H04N 5/37457* (2013.01)

(58) Field of Classification Search
CPC ...... H04N 5/379; H04N 5/3742; H04N 5/374; H01L 27/14641; H01L 27/14634
USPC .................................................. 348/294–324
See application file for complete search history.

(56) References Cited

FOREIGN PATENT DOCUMENTS

| | | |
|---|---|---|
| JP | 2014-30170 A | 2/2014 |
| JP | 2014-158086 A | 8/2014 |

\* cited by examiner

SOLID-STATE IMAGING DEVICE

This application is a continuation application based on International Patent Application No. PCT/JP2015/059087, filed Mar. 25, 2015, and the content thereof is incorporated herein by reference.

BACKGROUND OF THE INVENTION

Field of the Invention

The present invention relates to a solid-state imaging device.

Description of Related Art

Japanese Patent Application Publication, First Publication No. 2013-90127 discloses a technology for miniaturizing a solid-state imaging device. The solid-state imaging device disclosed in Japanese Patent Application Publication, First Publication No. 2013-90127 has a plurality of laminated substrates on which pixels and other circuits are distributed. Demand for miniaturization of electronic devices requires further miniaturization of solid-state imaging devices.

SUMMARY OF THE INVENTION

According to a first aspect of the present invention, a solid-state imaging device includes a first substrate, a second substrate, and a connection portion. The second substrate is laminated on the first substrate. The connection portion is disposed between the first substrate and the second substrate. The first substrate includes a plurality of pixels and a plurality of first control signal lines. The plurality of pixels are arranged in a matrix to output pixel signals according to control signals. The plurality of first control signal lines are connected to pixels of each row in an array of the plurality of pixels. The second substrate includes a plurality of second control signal lines and a control circuit. The plurality of second control signal lines are arranged in correspondence with the plurality of first control signal lines. The control circuit is connected to the plurality of second control signal lines to output the control signals. An arrangement of each of the plurality of second control signal lines on the second substrate corresponds to an arrangement of a corresponding one of the plurality of first control signal lines on the first substrate. The connection portion includes a plurality of control connections and a plurality of readout connections. Each of the plurality of control connections is connected to one of the plurality of first control signal lines and a corresponding one of the plurality of second control signal lines. The plurality of readout connections are configured to output the pixel signals output from the plurality of pixels to the second substrate.

According to a second aspect of the present invention, in the first aspect, the first substrate may further include a plurality of first readout signal lines, each being connected to pixels of each column in the array of the plurality of pixels. Each of the plurality of readout connections may be connected to one of the plurality of first readout signal lines.

According to a third aspect of the present invention, in the second aspect, the second substrate may further include a plurality of second readout signal lines arranged in correspondence with the plurality of first readout signal lines. Each of the plurality of readout connections may be connected to one of the plurality of first readout signal lines and a corresponding one of the plurality of second readout signal lines.

According to a fourth aspect of the present invention, in the first aspect, the number of control connections connected to one of the first control signal lines connected to pixels in the same row in the array of the plurality of pixels may be smaller than the number of columns in the array of the plurality of pixels.

According to a fifth aspect of the present invention, in the first aspect, the number of readout connections to which the pixel signals output from pixels of the same column in the array of the plurality of pixels are input may be smaller than the number of rows in the array of the plurality of pixels.

According to a sixth aspect of the present invention, in the first aspect, two or more of the control connections may be connected to one of the plurality of first control signal lines and a corresponding one of the plurality of second control signal lines.

According to a seventh aspect of the present invention, in the first aspect, a cross-sectional area of each of the plurality of readout connections may be greater than a cross-sectional area of each of the plurality of control connections.

According to an eighth aspect of the present invention, in the first aspect, the control circuit may be configured to output a plurality of the control signals that are provided to each of the plurality of pixels. A length of a path of each of the plurality of the control signals from the control circuit to each of the plurality of pixels may be different for each of the plurality of the control signals.

DETAILED DESCRIPTION OF THE INVENTION

Embodiments of the present invention will now be described with reference to the drawings.

First Embodiment

Figure 1:
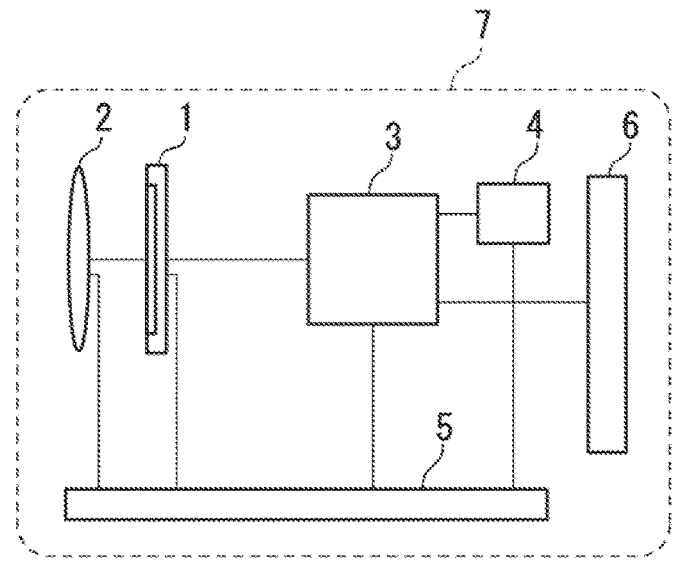
FIG. 1 is a block diagram showing a configuration of an imaging device according to a first embodiment of the present invention.

FIG. 1 shows a configuration of an imaging device 7 according to a first embodiment of the present invention. The imaging device 7 may be an electronic device having an imaging function. For example, the imaging device 7 is one of a digital camera, a digital video camera, an endoscope, and a microscope. As shown in FIG. 1, the imaging device 7 includes a solid-state imaging device 1, a lens unit 2, an image signal processing device 3, a recording device 4, a camera control device 5, and a display device 6.

The solid-state imaging device 1 converts a subject image formed on a light receiving surface into a signal such as a captured image signal and outputs the signal. The lens unit 2 has a zoom lens and a focus lens. The lens unit 2 forms a subject image based on light from a subject on the light receiving surface of the solid-state imaging device 1. Light received through the lens unit 2 is imaged on the light receiving surface of the solid-state imaging device 1.

The image signal processing device 3 performs predetermined processing on the signal output from the solid-state imaging device 1. Processing performed by the image signal processing device 3 includes conversion into image data, various correction of image data, compression of image data, or the like.

The recording device 4 has a semiconductor memory or the like for recording or reading image data. The recording device 4 is attachable to and detachable from the imaging device 7. The display device 6 displays an image based on image data processed by the image signal processing device 3 or image data read from the recording device 4.

The camera control device 5 controls the entirety of the imaging device 7. Operations of the camera control device 5 are defined in a program stored in a ROM provided in the imaging device 7. The camera control device 5 reads this program and performs various sorts of control according to content defined by the program.

Figure 2:
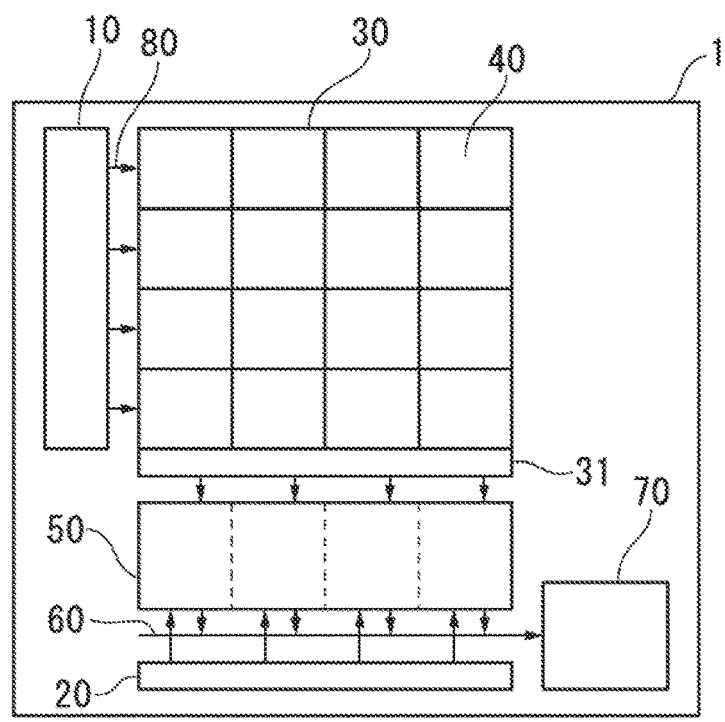
FIG. 2 is a block diagram showing a configuration of a solid-state imaging device according to the first embodiment of the present invention.

FIG. 2 shows a configuration of the solid-state imaging device 1. As shown in FIG. 2, the solid-state imaging device 1 includes a vertical readout circuit 10 (a control circuit), a horizontal readout circuit 20, a pixel portion 30, a memory unit 31, a signal processing circuit 50, and an output unit 70.

The pixel portion 30 has a plurality of pixels 40. Although a plurality of pixels 40 are arranged in FIG. 2, a reference numeral of a single pixel 40 is shown as a representative. The plurality of pixels 40 are arranged in a matrix. The plurality of pixels 40 output pixel signals according to control signals. The plurality of pixels 40 are connected to the memory unit 31. The plurality of pixels 40 output pixel signals to the memory unit 31. The memory unit 31 holds the pixel signals output from the plurality of pixels 40. The pixel signals held in the memory unit 31 are output to the signal processing circuit 50.

The vertical readout circuit 10 controls reading of pixel signals from the plurality of pixels 40. More specifically, the vertical readout circuit 10 outputs control signals for controlling reading of pixel signals to control signal lines 80. The control signals are transferred to the plurality of pixels 40 through the control signal lines 80. Through these control signals, pixel signals are simultaneously read from two or more pixels 40 arranged in the same row in the array of the plurality of pixels 40.

The signal processing circuit 50 performs signal processing on pixel signals under the control of the horizontal readout circuit 20. For example, the signal processing circuit 50 performs processing such as noise suppression by correlated double sampling (CDS).

The horizontal readout circuit 20 reads out the pixel signals processed by the signal processing circuit 50 to a horizontal signal line 60. More specifically, the horizontal readout circuit 20 outputs, to the signal processing circuit 50, control signals for controlling signal processing of the signal processing circuit 50 and reading of pixel signals. By this control, pixel signals output from two or more pixels 40 arranged in the same row in the array of the plurality of pixels 40 are sequentially read out to the horizontal signal line 60.

The output unit 70 outputs pixel signals processed by the signal processing circuit 50 to the outside. More specifically, the output unit 70 appropriately performs processing such as amplification processing on the pixel signals processed by the signal processing circuit 50. The output unit 70 then outputs the processed pixel signals to the outside.

Figure 3:
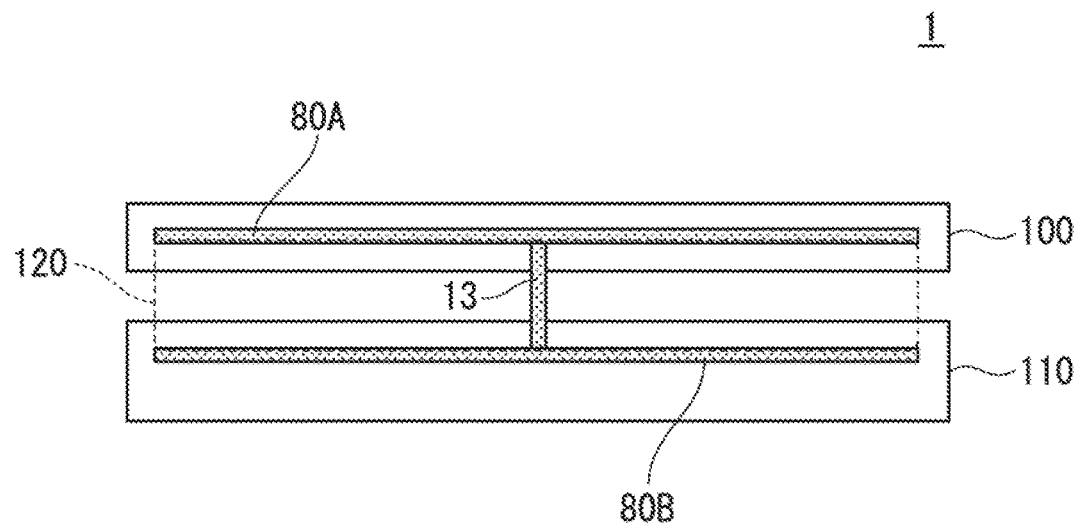
FIG. 3 is a cross-sectional view of the solid-state imaging device according to the first embodiment of the present invention.
Figure 4:
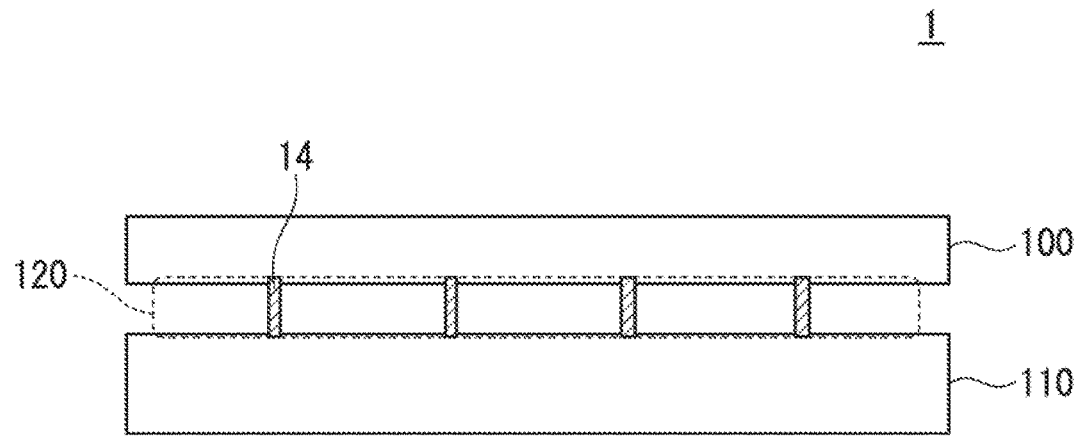
FIG. 4 is a cross-sectional view of the solid-state imaging device according to the first embodiment of the present invention.

FIGS. 3 and 4 show different cross sections of the solid-state imaging device 1. As shown in FIGS. 3 and 4, the solid-state imaging device 1 includes a first substrate 100, a second substrate 110, and a connection portion 120. The second substrate 110 is laminated on the first substrate 100. The connection portion 120 is disposed between the first substrate 100 and the second substrate 110.

The connection portion 120 has a plurality of control connections 13 and a plurality of readout connections 14. A single control connection 13 is shown in FIG. 3. The plurality of control connections 13 and the plurality of readout connections 14 electrically connect the first substrate 100 and the second substrate 110. The plurality of control connections 13 transfer control signals between the first substrate 100 and the second substrate 110. The plurality of readout connections 14 transfer pixel signals between the first substrate 100 and the second substrate 110.

The first substrate 100 further includes a plurality of first control signal lines 80A. A single first control signal line 80A is shown in FIG. 3. The second substrate 110 further includes a plurality of second control signal lines 80B. A single second control signal line 80B is shown in FIG. 3. The plurality of first control signal lines 80A and the plurality of second control signal lines 80B correspond to the control signal lines 80 in FIG. 2. The plurality of first control signal lines 80A transfer control signals on the first substrate 100. The plurality of second control signal lines 80B transfer control signals on the second substrate 110.

Figure 5:
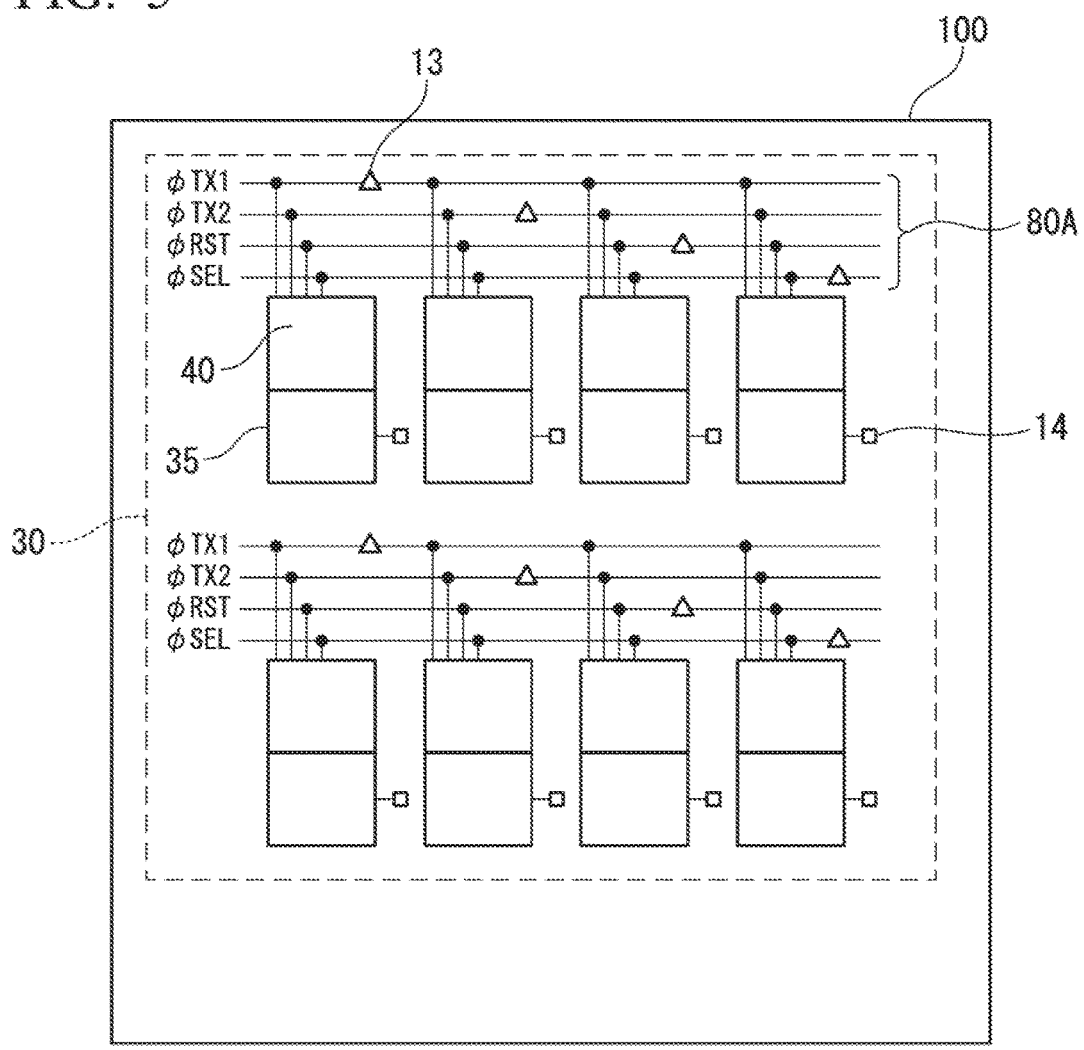
FIG. 5 is a block diagram showing a configuration of a first substrate included in the solid-state imaging device according to the first embodiment of the present invention.

FIG. 5 shows a configuration of the first substrate 100. As shown in FIG. 5, the first substrate 100 includes the pixel portion 30 and the plurality of first control signal lines 80A. The positions of the plurality of control connections 13 and the plurality of readout connections 14 are shown in FIG. 5. The sizes of the plurality of control connections 13 and the plurality of readout connections 14 are not shown in FIG. 5. Although a plurality of control connections 13 are arranged in FIG. 5, a reference numeral of a single control connection 13 is shown as a representative. Although a plurality of readout connections 14 are arranged in FIG. 5, a reference numeral of a single readout connection 14 is shown as a representative. Although a plurality of first control signal lines 80A are arranged in FIG. 5, a reference numeral of four first control signal lines 80A is shown as a representative.

The pixel portion 30 has a plurality of pixels 40. Although a plurality of pixels 40 are arranged in FIG. 5, a reference numeral of a single pixel 40 is shown as a representative. The plurality of pixels 40 are arranged in a matrix. The plurality of pixels 40 output pixel signals according to control signals. The pixel portion 30 includes a plurality of shared pixels 35. Although a plurality of shared pixels 35 are arranged in FIG. 5, a reference numeral of a single shared pixel 35 is shown as a representative. Each of the plurality of shared pixels 35 includes two or more pixels 40. In FIG. 5, each of the plurality of shared pixels 35 includes two pixels 40 arranged in a column direction of the array of the plurality of pixels 40. Two pixels 40 included in one shared pixel 35 share a part of a circuit constituting the pixels 40.

The plurality of first control signal lines 80A are arranged in a row direction of the array of the plurality of pixels 40. The plurality of first control signal lines 80A are connected to pixels 40 of each row in the array of the plurality of pixels 40. Each of the plurality of control connections 13 is connected to one of the plurality of first control signal lines 80A. In FIG. 5, a single control connection 13 is connected to a single first control signal line 80A. Control signals transferred to the first substrate 100 through the plurality of control connections 13 are transferred to the plurality of pixels 40 through the plurality of first control signal lines 80A.

Four control signals are shown in FIG. 5. The four control signals are a control signal ϕTX1, a control signal ϕTX2, a control signal ϕRST, and a control signal ϕSEL. These control signals will be described later. At least a part of the plurality of first control signal lines 80A is commonly connected to two pixels 40 included in one shared pixel 35. Therefore, at least a part of the plurality of control signals is commonly provided to two pixels 40 included in one shared pixel 35.

The number of control connections 13 connected to one first control signal line 80A connected to pixels 40 in the same row in the array of the plurality of pixels 40 may be smaller than the number of columns in the array of the plurality of pixels 40. In FIG. 5, the number of control connections 13 connected to one first control signal line 80A connected to pixels 40 in the same row is 1. In FIG. 5, the number of columns in the array of the plurality of pixels 40 is 4.

The plurality of pixels 40 output pixel signals according to control signals. Each of the plurality of pixels 40 is connected to one of the plurality of readout connections 14. That is, each of the plurality of readout connections 14 is arranged so as to correspond to each of two pixels 40 included in a corresponding shared pixel 35. The plurality of readout connections 14 output the pixel signals output from the plurality of pixels 40 to the second substrate 110. That is, the pixel signals output from the plurality of pixels 40 are transferred to the second substrate 110 through the plurality of readout connections 14.

Figure 6:
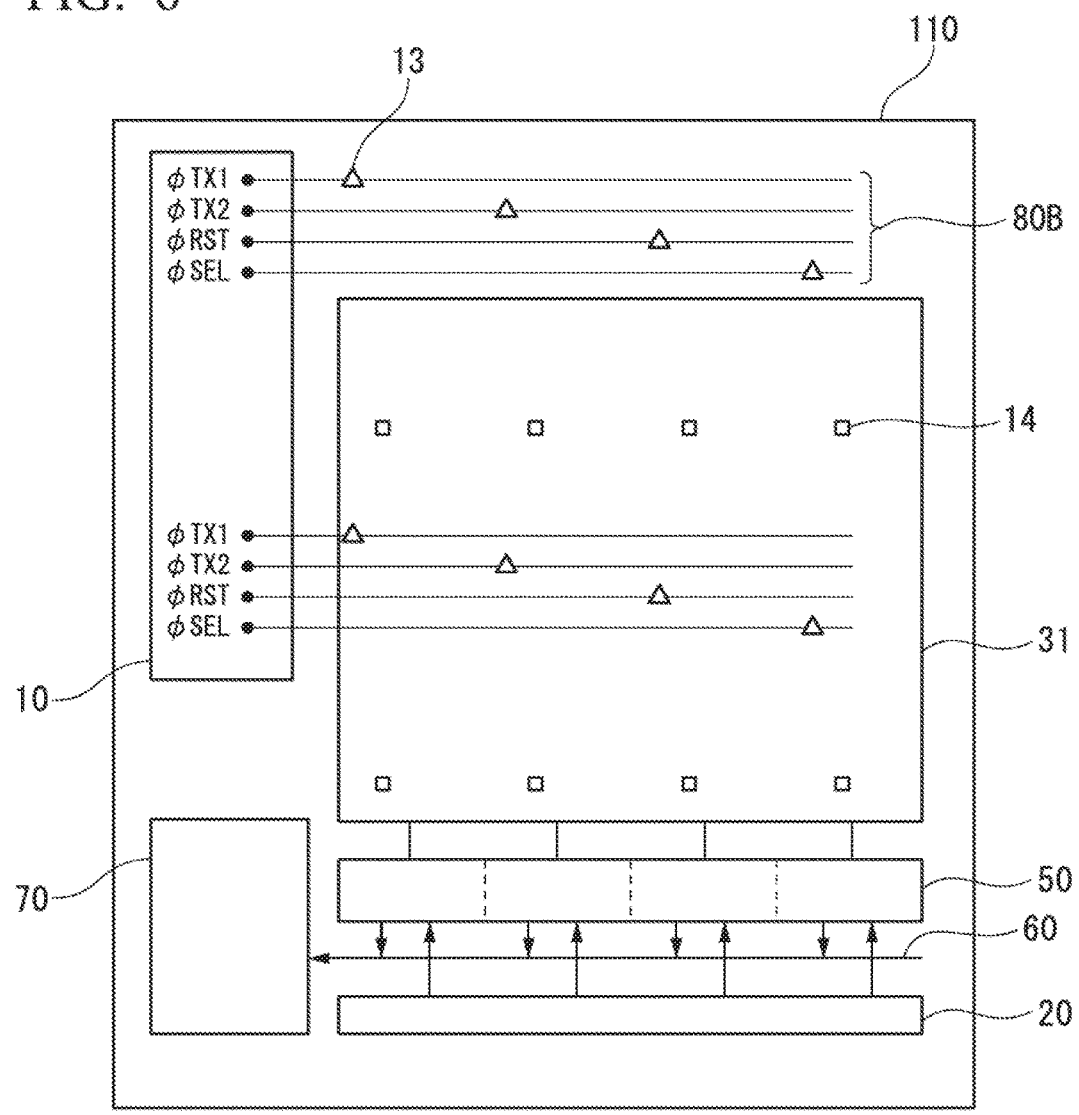
FIG. 6 is a block diagram showing a configuration of a second substrate included in the solid-state imaging device according to the first embodiment of the present invention.

FIG. 6 shows a configuration of the second substrate 110. As shown in FIG. 6, the second substrate 110 includes a vertical readout circuit 10, a horizontal readout circuit 20, a memory unit 31, a signal processing circuit 50, an output unit 70, and a plurality of second control signal lines 80B. The positions of the plurality of control connections 13 and the plurality of readout connections 14 are shown in FIG. 6. The sizes of the plurality of control connections 13 and the plurality of readout connections 14 are not shown in FIG. 6. Although a plurality of control connections 13 are arranged in FIG. 6, a reference numeral of a single control connection 13 is shown as a representative. Although a plurality of readout connections 14 are arranged in FIG. 6, a reference numeral of a single readout connection 14 is shown as a representative. Although a plurality of second control signal lines 80B are arranged in FIG. 6, a reference numeral of four second control signal lines 80B is shown as a representative.

The plurality of second control signal lines 80B are arranged in the row direction of the array of the plurality of pixels 40. The plurality of second control signal lines 80B are arranged in correspondence with the plurality of first control signal lines 80A. Each of the plurality of control connections 13 is connected to one of the plurality of second control signal lines 80B. In FIG. 6, a single control connection 13 is connected to a single second control signal line 80B. As shown in FIGS. 5 and 6, each of the plurality of control connections 13 is connected to one of the plurality of first control signal lines 80A and a corresponding one of the plurality of second control signal lines 80B. Positions in the row direction of the plurality of control connections 13 corresponding to different control signals are different from each other. For example, a position in the row direction of a control connection 13 corresponding to the control signal ϕTX1 is different from a position in the row direction of a control connection 13 corresponding to the control signal ϕTX2. Two or more control connections 13 may be connected to one of the plurality of first control signal lines 80A and a corresponding one of the plurality of second control signal lines 80B.

The vertical readout circuit 10 is connected to a plurality of second control signal lines 80B. The vertical readout circuit 10 outputs control signals. The control signals output from the vertical readout circuit 10 are transferred to the plurality of control connections 13 through the plurality of second control signal lines 80B. The plurality of control connections 13 output the control signals output from the vertical readout circuit 10 to the first substrate 100.

The plurality of readout connections 14 output pixel signals output from the plurality of pixels 40 to the second substrate 110. The plurality of readout connections 14 are connected to the memory unit 31. The pixel signals transferred through the plurality of readout connections 14 are input to the memory unit 31. The horizontal readout circuit 20, the memory unit 31, the signal processing circuit 50, and the output unit 70 have already been described and therefore descriptions thereof are omitted.

The vertical readout circuit 10 outputs a plurality of control signals provided to each of the plurality of pixels 40. Four control signals are shown in FIG. 6. The four control signals are the control signal ϕTX1, the control signal ϕTX2, the control signal ϕRST, and the control signal ϕSEL. Each of the control signal ϕTX1 and the control signal ϕTX2 corresponds to one of the two pixels 40 constituting a shared pixel 35. The control signal ϕRST and the control signal ϕSEL commonly correspond to the two pixels 40 constituting the shared pixel 35.

The length of a path of each of the plurality of control signals from the vertical readout circuit 10 to each of the plurality of pixels 40 is different for each of the plurality of control signals. The length of the path of each of the plurality of control signals is the sum of the length of the second control signal line 80B from the vertical readout circuit 10 to the control connection 13 and the length of the first control signal line 80A from the control connection 13 to the pixel 40. For example, the length of the path of the control signal ϕTX is different from the length of the path of the control signal ϕTX2.

The control connection 13 can be disposed at an arbitrary position between the first control signal line 80A and the second control signal line 80B. Therefore, as shown in FIGS. 5 and 6, it is possible to dispose a plurality of control connections 13 such that positions in the row direction of a plurality of control connections 13 corresponding to a plurality of different control signals are different from each other. This enlarges a region in which the plurality of control connections 13 can be arranged.

Figure 7:
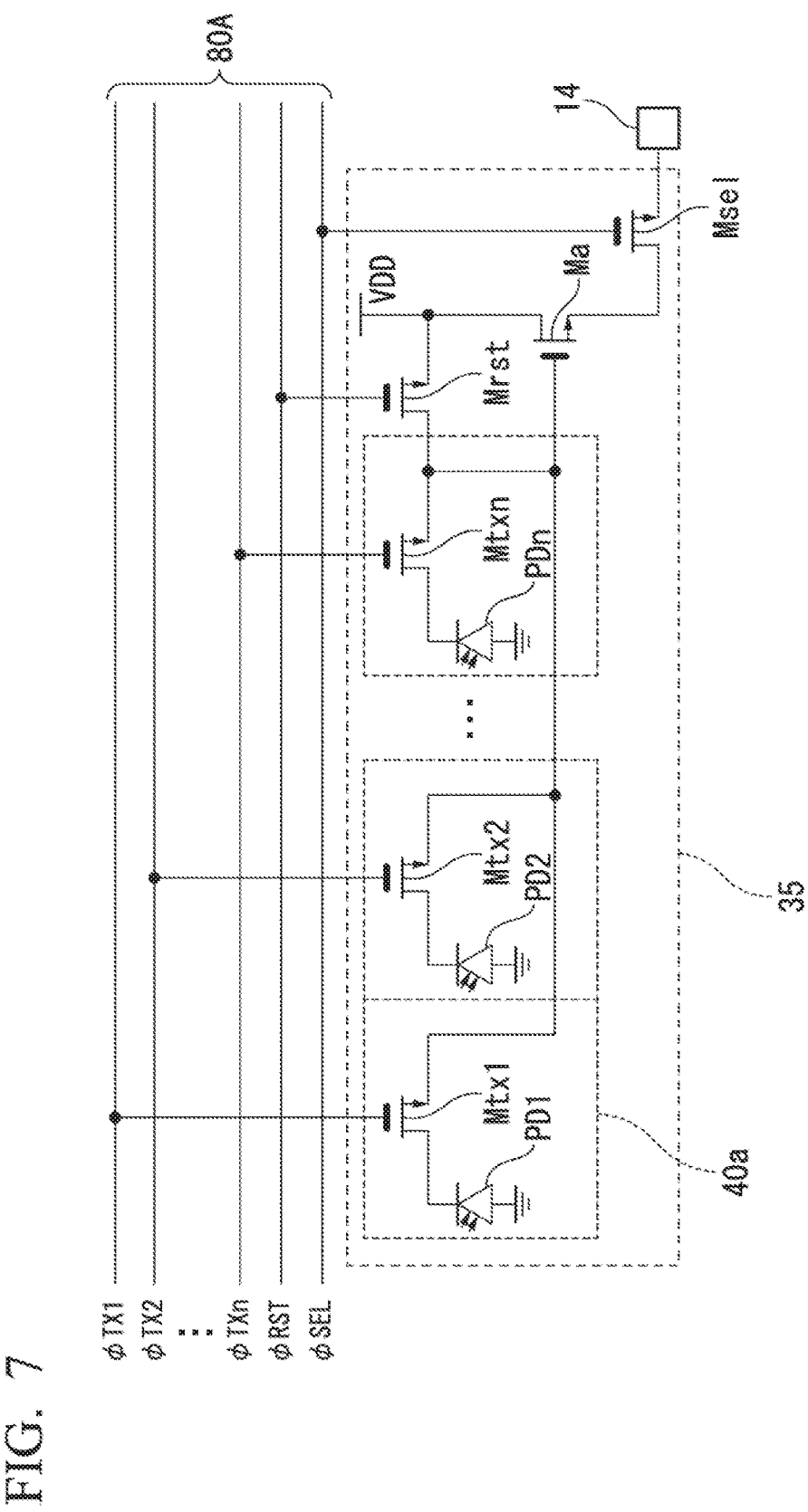
FIG. 7 is a circuit diagram showing a configuration of a shared pixel included in the solid-state imaging device according to the first embodiment of the present invention.

FIG. 7 shows a configuration of a shared pixel 35. As shown in FIG. 7, the shared pixel 35 includes a plurality of pixel circuits 40a, an amplification transistor Ma, a reset transistor Mrst, and a selection transistor Msel. Each of the plurality of pixels 40 has a pixel circuit 40a. The plurality of pixels 40 share the amplification transistor Ma, the reset transistor Mrst, and the selection transistor Msel. In FIG. 7, the plurality of pixel circuits 40a constituting the shared pixel 35 are arranged in a lateral direction of FIG. 7 to avoid complicating the arrangement of each element.

The pixel circuit 40a includes a photoelectric conversion element PDk and a transfer transistor Mtxk. k is an integer from 1 to n. n is an integer of 2 or more. n is the number of pixels 40 constituting the shared pixel 35. The transfer transistor Mtxk, the amplification transistor Ma, the reset transistor Mrst, and the selection transistor Msel are N-type transistors. These transistors may also be P-type transistors.

An input terminal of the photoelectric conversion element PDk is connected to ground. A drain of the transfer transistor Mtxk is connected to an output terminal of the photoelectric conversion element PDk. A gate of the transfer transistor Mtxk is connected to a first control signal line 80A. The control signal ϕTXk is input to the gate of the transfer transistor Mtxk.

A source of the reset transistor Mrst is connected to a power supply terminal. A power supply voltage VDD is input to the power supply terminal. A drain of the reset transistor Mrst is connected to the sources of the plurality of transfer transistors Mtxk. A gate of the reset transistor Mrst is connected to a first control signal line 80A. The control signal ϕRST is provided to the reset transistor Mrst.

A drain of the amplification transistor Ma is connected to the power supply terminal. A gate of the amplification transistor Ma is connected to the sources of the plurality of transfer transistors Mtxk. A drain of the selection transistor Msel is connected to a source of the amplification transistor Ma. A source of the selection transistor Msel is connected to a readout connection 14. A gate of the selection transistor Msel is connected to a first control signal line 80A. The control signal ϕSEL is provided to the selection transistor Msel.

For example, the photoelectric conversion element PDk is a photodiode. The photoelectric conversion element PDk generates electric charge based on the amount of light incident on the solid-state imaging device 1. The photoelectric conversion element PDk holds the generated electric charge. The transfer transistor Mtxk transfers the electric charge held at the photoelectric conversion element PDk to the gate of the amplification transistor Ma. On/off of the transfer transistor Mtxk is controlled by the control signal ϕTXk. Electric charge transferred by the transfer transistor Mtxk is held at the gate of the amplification transistor Ma.

The reset transistor Mrst resets electric charge held at the photoelectric conversion element PDk and electric charge held at the gate of the amplification transistor Ma. On/off of the reset transistor Mrst is controlled by the control signal ϕRST. Electric charge held at the photoelectric conversion element PDk is reset by simultaneously turning on the reset transistor Mrst and the transfer transistor Mtxk.

The amplification transistor Ma outputs a pixel signal obtained by amplifying a signal based on electric charge held at the gate through the source. The selection transistor Msel reads the pixel signal output from the amplification transistor Ma and outputs the pixel signal to the readout connection 14. On/off of the selection transistor Msel is controlled by the control signal ϕSEL.

The control signal ϕRST and the control signal ϕSEL are commonly provided to two or more pixels 40 included in one shared pixel 35. Therefore, a first control signal line 80A transferring the control signal ϕRST and a first control signal line 80A transferring the control signal ϕSEL are commonly connected to two or more pixels 40 included in one shared pixel 35.

A part of the circuit constituting the plurality of pixels 40 need not be shared by two or more pixels 40. That is, each of the plurality of pixels 40 may be independent of the other pixels 40. The configuration of the pixel 40 is not limited to the configuration shown in FIG. 7.

The solid state imaging device according to each aspect of the present invention need not have a configuration corresponding to at least one of the horizontal readout circuit 20, the memory unit 31, the signal processing circuit 50, and the output unit 70.

According to the first embodiment, the solid-state imaging device 1 is configured to include the first substrate 100, the second substrate 110, and the connection portion 120. The first substrate 100 has a plurality of pixels 40 and a plurality of first control signal lines 80A. The second substrate 110 has a plurality of second control signal lines 80B and a vertical readout circuit 10 (a control circuit). The connection portion 120 has a plurality of control connections 13 and a plurality of readout connections 14.

In the first embodiment, the plurality of first control signal lines 80A are arranged on the first substrate 100 and the plurality of second control signal lines 80B are arranged on the second substrate 110. Each of the plurality of control connections 13 is connected to one of the plurality of first control signal lines 80A and a corresponding one of the plurality of second control signal lines 80B. This enlarges a region in which the plurality of control connections 13 can be arranged. As a result, the pitch of control connections 13 is increased and therefore it is possible to reduce defects in electrical connection between the two substrates. Thus, the yield is improved.

The number of control connections 13 connected to one first control signal line 80A connected to pixels 40 in the same row in the array of the plurality of pixels 40 may be smaller than the number of columns in the array of the plurality of pixels 40. This increases the pitch of control connections 13. As a result, contact between two control connections 13 is avoided. That is, it is possible to reduce defects in electrical connection between the two substrates.

Two or more control connections 13 may be connected to one of the plurality of first control signal lines 80A and a corresponding one of the plurality of second control signal lines 80B. The resistance of a control signal path between the first substrate 100 and the second substrate 110 is reduced by connecting two or more control connections 13 to one first control signal line 80A and one second control signal line 80B. This reduces voltage drop of the control signals. The pixels 40 may not operate properly due to voltage drop of the control signals. Reducing the voltage drop of the control signals reduces defective operations of the pixels 40.

Second Embodiment

Figure 8:
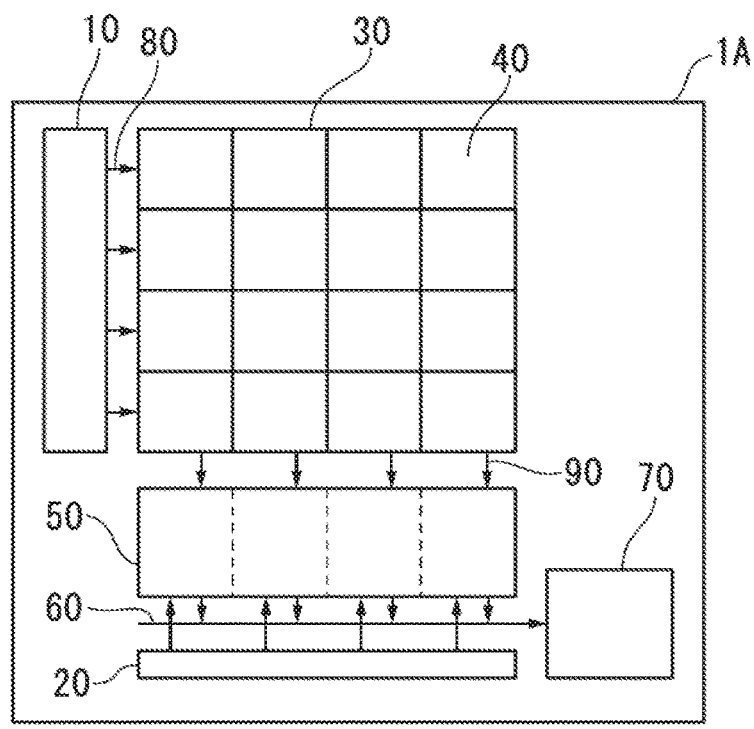
FIG. 8 is a block diagram showing a configuration of a solid-state imaging device according to a second embodiment of the present invention.

In a second embodiment of the present invention, the solid-state imaging device 1 shown in FIG. 2 is replaced with a solid-state imaging device 1A shown in FIG. 8. FIG. 8 shows a configuration of the solid-state imaging device 1A. As shown in FIG. 8, the solid-state imaging device 1A includes a vertical readout circuit 10 (a control circuit), a horizontal readout circuit 20, a pixel portion 30, a signal processing circuit 50, and an output unit 70.

Parts of the configuration shown in FIG. 8 different from the configuration shown in FIG. 2 are described below.

In the solid-state imaging device 1A, the memory unit 31 in the solid-state imaging device 1 shown in FIG. 2 has been removed. Pixel signals output from a plurality of pixels 40 are transferred to the signal processing circuit 50 through vertical signal lines 90.

Parts other than the above of the configuration shown in FIG. 8 are the same as those of the configuration shown in FIG. 2.

Figure 9:
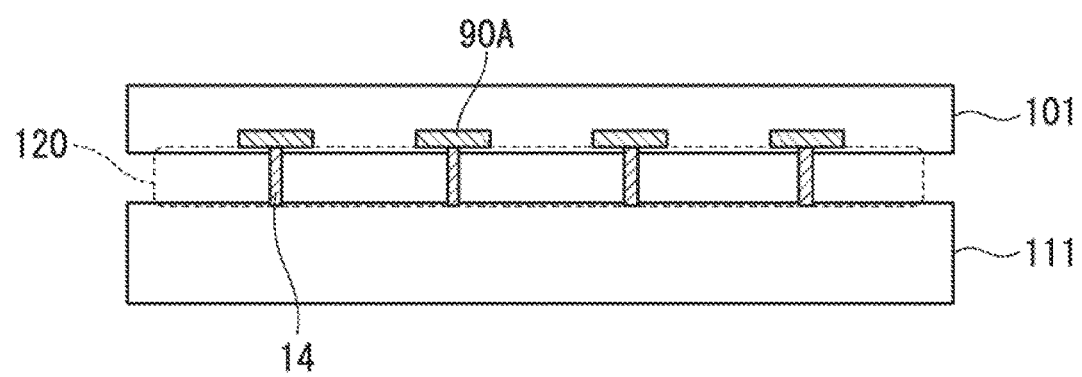
FIG. 9 is a cross-sectional view of the solid-state imaging device according to the second embodiment of the present invention.

FIG. 9 shows a cross-section of the solid-state imaging device 1A. As shown in FIG. 9, the solid-state imaging device 1A includes a first substrate 101, a second substrate 111, and a connection portion 120.

Parts of the configuration shown in FIG. 9 different from the configuration shown in FIG. 4 are described below.

In the solid-state imaging device 1A, the first substrate 100 shown in FIG. 4 is replaced with the first substrate 101 shown in FIG. 9. In the solid-state imaging device 1A, the second substrate 110 shown in FIG. 4 is also replaced with the second substrate 111 shown in FIG. 9.

The first substrate 101 has a plurality of first vertical signal lines 90A (first readout signal lines). Although a plurality of first vertical signal lines 90A are provided in FIG. 9, a reference numeral of a single first vertical signal line 90A is shown as a representative. The plurality of first vertical signal lines 90A correspond to the vertical signal lines 90 in FIG. 8. The plurality of first vertical signal lines 90A transfer pixel signals on the first substrate 101.

Parts other than the above of the configuration shown in FIG. 9 are the same as those of the configuration shown in FIG. 4. A cross-section including a control connection 13 of the solid-state imaging device 1A is the same as the cross-section of the solid-state imaging device 1 shown in FIG. 3.

Figure 10:
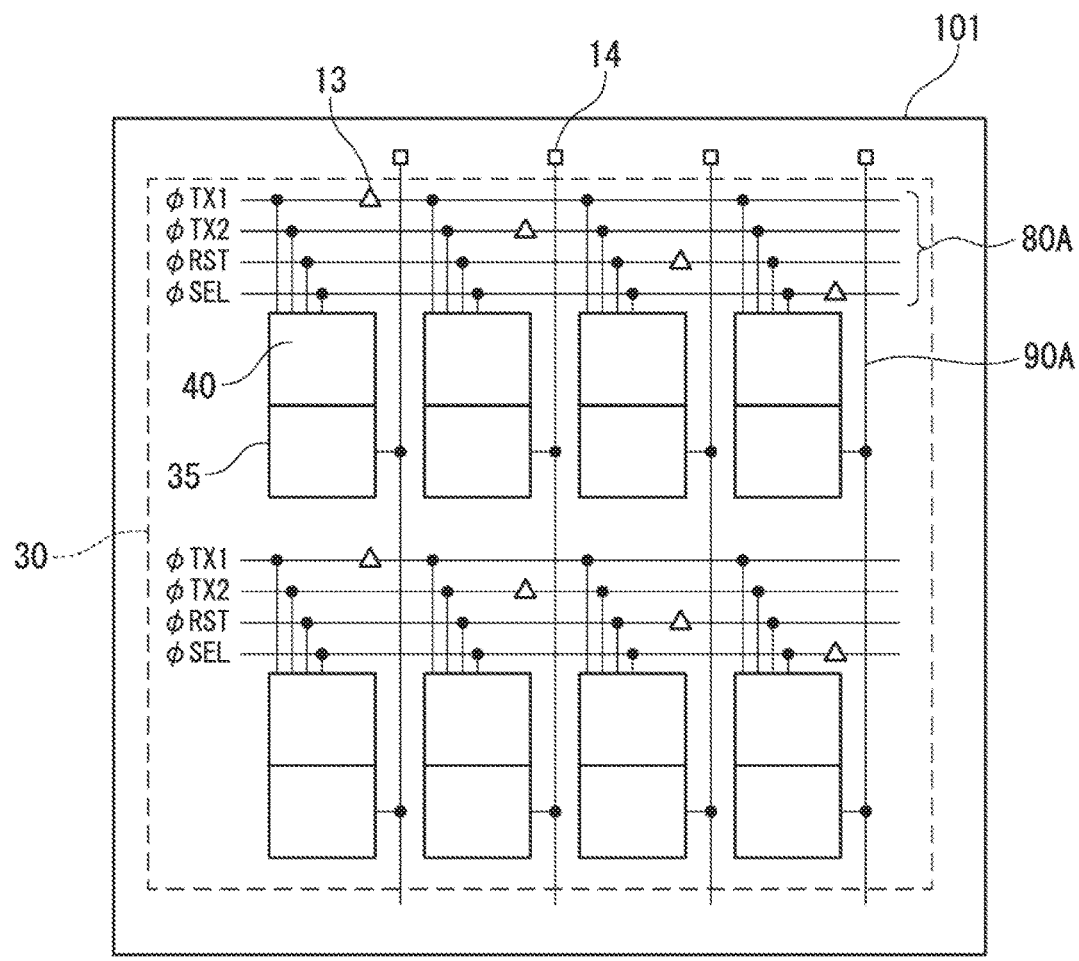
FIG. 10 is a block diagram showing a configuration of a first substrate included in the solid-state imaging device according to the second embodiment of the present invention.

FIG. 10 shows a configuration of the first substrate 101. As shown in FIG. 10, the first substrate 101 includes a pixel portion 30, a plurality of first control signal lines 80A, and a plurality of first vertical signal lines 90A. The positions of a plurality of control connections 13 and a plurality of readout connections 14 are shown in FIG. 10. The sizes of the plurality of control connections 13 and the plurality of readout connections 14 are not shown in FIG. 10. Although a plurality of control connections 13 are arranged in FIG. 10, a reference numeral of a single control connection 13 is shown as a representative. Although a plurality of readout connections 14 are arranged in FIG. 10, a reference numeral of a single readout connection 14 is shown as a representative. Although a plurality of first control signal lines 80A are arranged in FIG. 10, a reference numeral of four first control signal lines 80A is shown as a representative. Although a plurality of first vertical signal lines 90A are arranged in FIG. 10, a reference numeral of a single first vertical signal line 90A is shown as a representative.

Parts of the configuration shown in FIG. 10 different from the configuration shown in FIG. 5 are described below.

The plurality of first vertical signal lines 90A are arranged in a column direction of the array of the plurality of pixels 40. Each of the plurality of first vertical signal lines 90A is connected to pixels 40 of each column in the array of the plurality of pixels 40. Each of the plurality of readout connections 14 is connected to one of the plurality of first vertical signal lines 90A. In FIG. 10, a single readout connection 14 is connected to a single first vertical signal line 90A. Pixel signals output from the plurality of pixels 40 are transferred to the plurality of readout connections 14 through the plurality of first vertical signal lines 90A. The plurality of readout connections 14 output the pixel signals output from the plurality of pixels 40 to the second substrate 111.

At least a part of the plurality of first vertical signal lines 90A is commonly connected to two pixels 40 included in one shared pixel 35. Therefore, pixel signals are output from two pixels 40 included in one shared pixel 35 to the common first vertical signal line 90A.

The first vertical signal lines 90A are arranged on the first substrate 101. Pixel signals output from pixels 40 in the same column in the array of the plurality of pixels 40 are transferred to one readout connection 14 through one first vertical signal line 90A. Therefore, the number of readout connections 14 to which pixel signals output from pixels 40 in the same column in the array of the plurality of pixels 40 are input can be reduced compared to the first substrate 100 shown in FIG. 5. In the first substrate 100 shown in FIG. 5, the number of readout connections 14 to which pixel signals output from pixels 40 in the same column are input is 2. In the first substrate 101 shown in FIG. 10, the number of readout connections 14 to which pixel signals output from pixels 40 in the same column are input is 1. This enlarges a region in which the plurality of control connections 13 can be arranged.

The number of readout connections 14 to which pixel signals output from pixels 40 in the same column in the array of the plurality of pixels 40 are input may be smaller than the number of rows in the array of the plurality of pixels 40. In FIG. 10, the number of readout connections 14 connected to one first vertical signal line 90A connected to pixels 40 in the same column is 1. In FIG. 10, the number of rows in the array of the plurality of pixels 40 is 4.

In FIG. 5, the plurality of readout connections 14 are arranged in a region in which the plurality of pixels 40 are arranged, that is, inside a pixel region. In FIG. 10, the plurality of readout connections 14 are arranged outside the pixel region. The plurality of readout connections 14 may also be arranged inside the pixel region. In FIG. 10, the region in which the plurality of control connections 13 can be arranged is enlarged compared to the case where the plurality of readout connections 14 are arranged inside the pixel region.

Parts other than the above of the configuration shown in FIG. 10 are the same as those of the configuration shown in FIG. 5.

Figure 11:
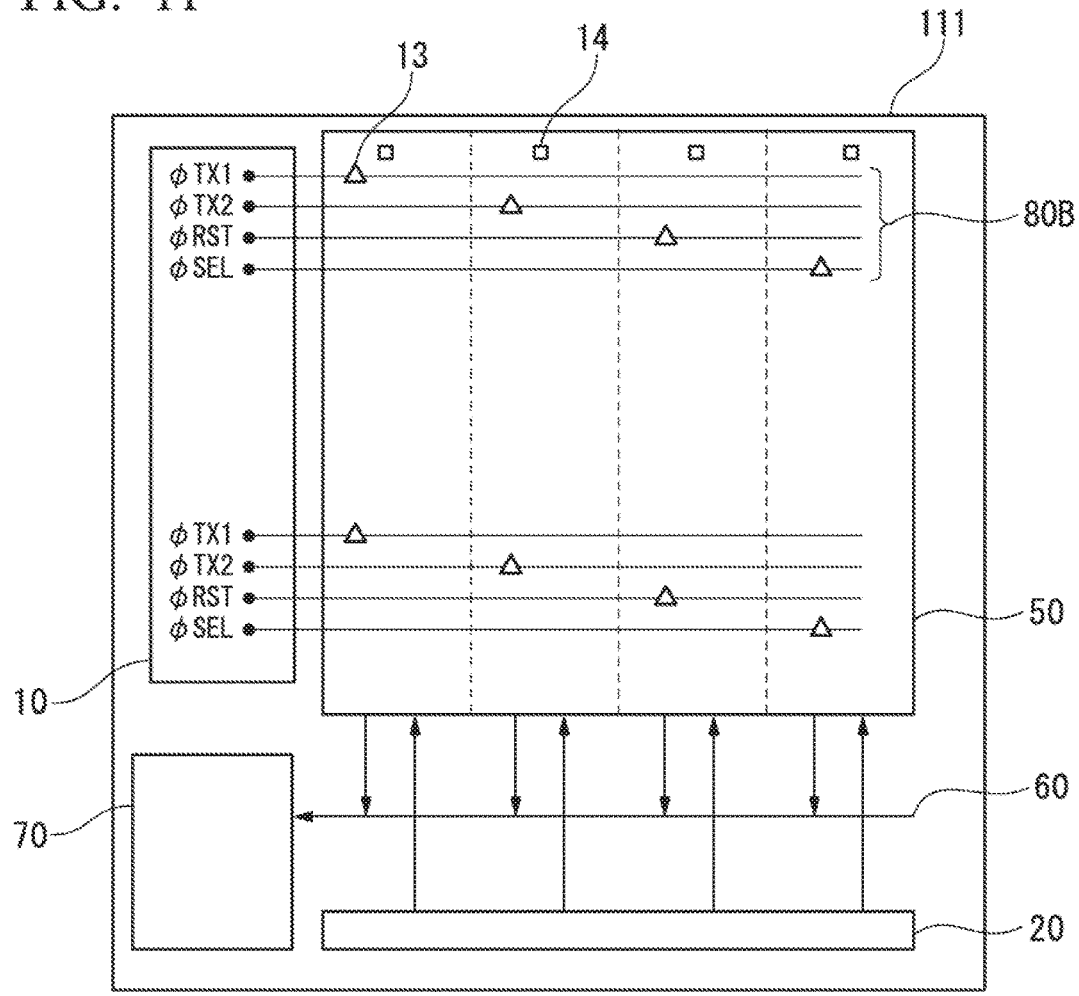
FIG. 11 is a block diagram showing a configuration of a second substrate included in the solid-state imaging device according to the second embodiment of the present invention.

FIG. 11 shows a configuration of the second substrate 111. As shown in FIG. 11, the second substrate 111 includes a vertical readout circuit 10, a horizontal readout circuit 20, a signal processing circuit 50, an output unit 70, and a plurality of second control signal lines 80B. The positions of the plurality of control connections 13 and the plurality of readout connections 14 are shown in FIG. 11. The sizes of the plurality of control connections 13 and the plurality of readout connections 14 are not shown in FIG. 11. Although a plurality of control connections 13 are arranged in FIG. 11, a reference numeral of a single control connection 13 is shown as a representative. Although a plurality of readout connections 14 are arranged in FIG. 1, a reference numeral of a single readout connection 14 is shown as a representative. Although a plurality of second control signal lines 801 are arranged in FIG. 11, a reference numeral of four second control signal lines 80B is shown as a representative.

Parts of the configuration shown in FIG. 11 different from the configuration shown in FIG. 6 are described below.

In the second substrate 111, the memory unit 31 in the second substrate 110 shown in FIG. 6 has been removed. The plurality of readout connections 14 are connected to the signal processing circuit 50. The plurality of readout connections 14 constitute an input portion of the signal processing circuit 50. Pixel signals transferred through the plurality of readout connections 14 are input to the signal processing circuit 50. Since the signal processing circuit 50 has already been described, a description of the signal processing circuit 50 is omitted.

Parts other than the above of the configuration shown in FIG. 11 are the same as those of the configuration shown in FIG. 6.

According to the second embodiment, the solid-state imaging device 1A is configured to include the first substrate 101, the second substrate 111, and the connection portion 120. The first substrate 101 has a plurality of pixels 40, a plurality of first control signal lines 80A, and a plurality of first vertical signal lines 90A (first readout signal lines). The second substrate 111 has a plurality of second control signal lines 80B and a vertical readout circuit 10 (control circuit). The connection portion 120 has a plurality of control connections 13 and a plurality of readout connections 14.

In the second embodiment, a plurality of first control signal lines 80A are arranged on the first substrate 101 and a plurality of second control signal lines 80B are arranged on the second substrate 111. Each of the plurality of control connections 13 is connected to one of the plurality of first control signal lines 80A and a corresponding one of the plurality of second control signal lines 80B. This enlarges a region in which the plurality of control connections 13 can be arranged. As a result, the pitch of control connections 13 is increased and therefore it is possible to reduce defects in electrical connection between the two substrates. Thus, the yield is improved.

In the second embodiment, each of the plurality of readout connections 14 is connected to one of the plurality of first vertical signal lines 90A. This can reduce the number of readout connections 14 to which pixel signals output from pixels 40 in the same column in the array of the plurality of pixels 40 are input. As a result, a region in which the plurality of control connections 13 can be arranged is enlarged. That is, defects in electrical connection between the two substrates can be reduced.

The number of readout connections 14 to which pixel signals output from pixels 40 in the same column in the array of the plurality of pixels 40 are input may be smaller than the number of rows in the array of the plurality of pixels 40. This increases the pitch of readout connections 14. As a result, contact between two readout connections 14 is avoided. That is, defects in electrical connection between the two substrates can be reduced.

Third Embodiment

Figure 12:
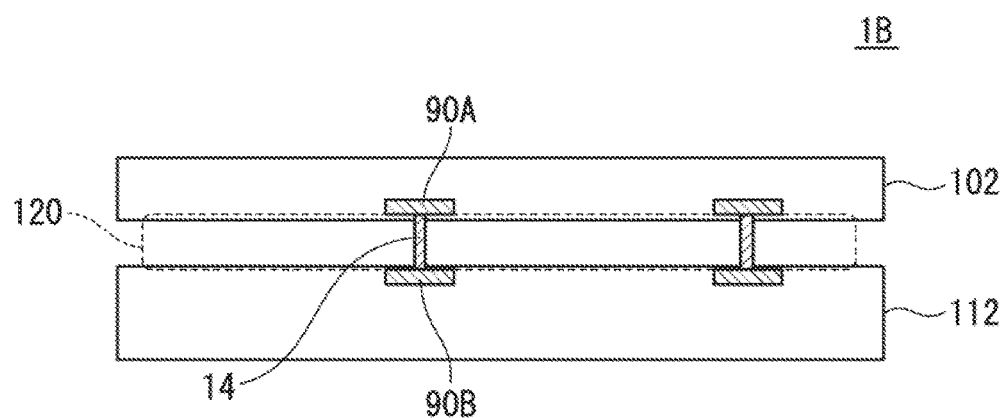
FIG. 12 is a cross-sectional view of a solid-state imaging device according to a third embodiment of the present invention.

In a third embodiment of the present invention, the solid-state imaging device 1A shown in FIG. 9 is replaced with a solid-state imaging device 1B shown in FIG. 12. FIG. 12 shows a cross-section of the solid-state imaging device 1B. As shown in FIG. 12, the solid-state imaging device 1B includes a first substrate 102, a second substrate 112, and a connection portion 120.

Parts of the configuration shown in FIG. 12 different from the configuration shown in FIG. 9 are described below.

In the solid-state imaging device 1B, the first substrate 101 shown in FIG. 9 is replaced with the first substrate 102 shown in FIG. 12. In the solid-state imaging device 1B, the second substrate 111 shown in FIG. 9 is also replaced with the second substrate 112 shown in FIG. 12.

Positions at which the plurality of readout connections 14 are arranged on the first substrate 102 are different from positions at which the plurality of readout connections 14 are arranged on the first substrate 101 shown in FIG. 9. The second substrate 112 has a plurality of second vertical signal lines 90B (second readout signal lines). Although a plurality of second vertical signal lines 90B are provided in FIG. 12, a reference numeral of a single second vertical signal line 90B is shown as a representative. The plurality of first vertical signal lines 90A and the plurality of second vertical signal lines 90B correspond to the vertical signal lines 90 in FIG. 8. The plurality of second vertical signal lines 90B transfer pixel signals on the second substrate 112.

Parts other than the above of the configuration shown in FIG. 12 are the same as those of the configuration shown in FIG. 9. A cross-section including a control connection 13 of the solid-state imaging device 1B is the same as the cross-section of the solid-state imaging device 1 shown in FIG. 3.

Figure 13:
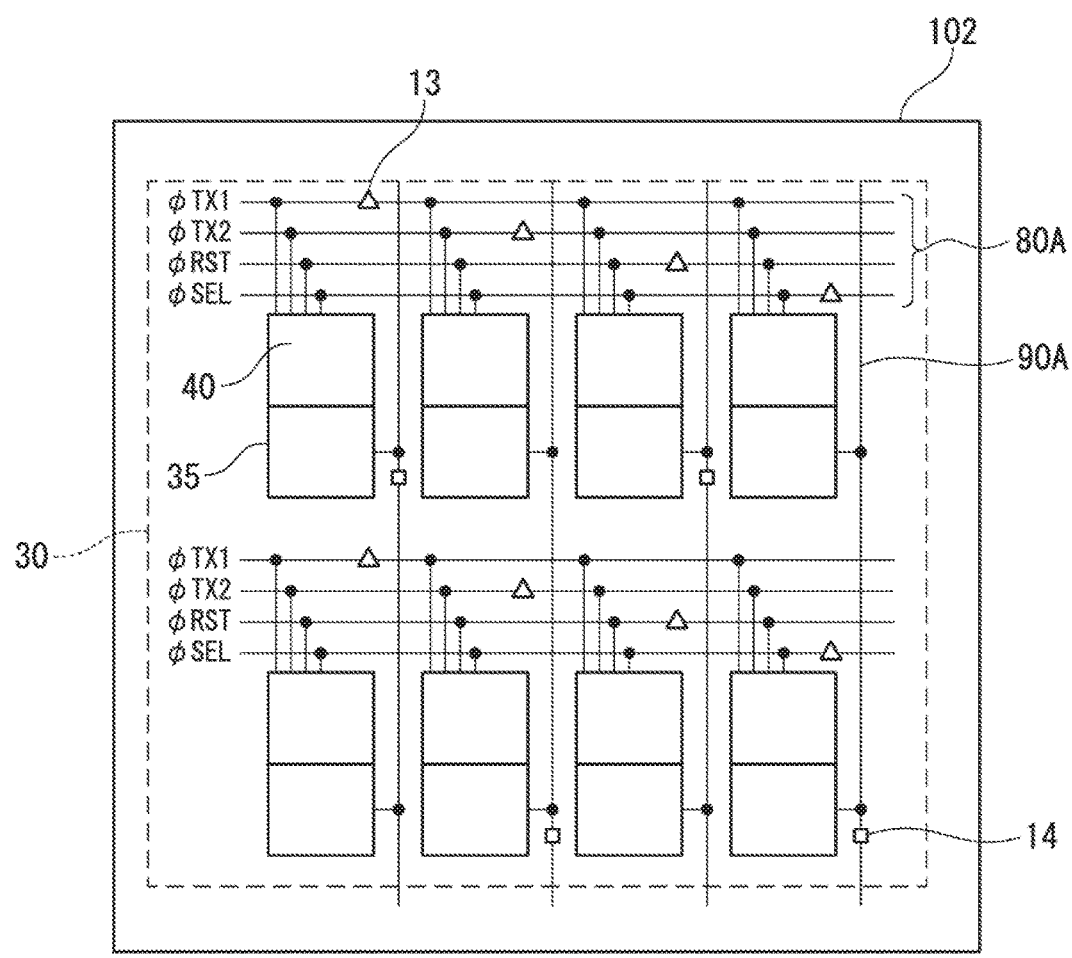
FIG. 13 is a block diagram showing a configuration of a first substrate included in the solid-state imaging device according to the third embodiment of the present invention.

FIG. 13 shows a configuration of the first substrate 102. As shown in FIG. 13, the first substrate 102 has a pixel portion 30, a plurality of first control signal lines 80A, and a plurality of first vertical signal lines 90A (first readout signal lines). The positions of the plurality of control connections 13 and the plurality of readout connections 14 are shown in FIG. 13. The sizes of the plurality of control connections 13 and the plurality of readout connections 14 are not shown in FIG. 13. Although a plurality of control connections 13 are arranged in FIG. 13, a reference numeral of a single control connection 13 is shown as a representative. Although a plurality of readout connections 14 are arranged in FIG. 13, a reference numeral of a single readout connection 14 is shown as a representative. Although a plurality of first control signal lines 80A are arranged in FIG. 13, a reference numeral of four first control signal lines 80A is shown as a representative. Although a plurality of first vertical signal lines 90A are arranged in FIG. 13, a reference numeral of a single first vertical signal line 90A is shown as a representative.

Parts of the configuration shown in FIG. 13 different from the configuration shown in FIG. 10 are described below.

The plurality of readout connections 14 are arranged in a region in which the plurality of pixels 40 are arranged, that is, inside a pixel region. Positions in the column direction of two readout connections 14 corresponding to two adjacent columns in the array of the plurality of pixels 40 are different from each other.

Parts other than the above of the configuration shown in FIG. 13 are the same as those of the configuration shown in FIG. 10.

Figure 14:
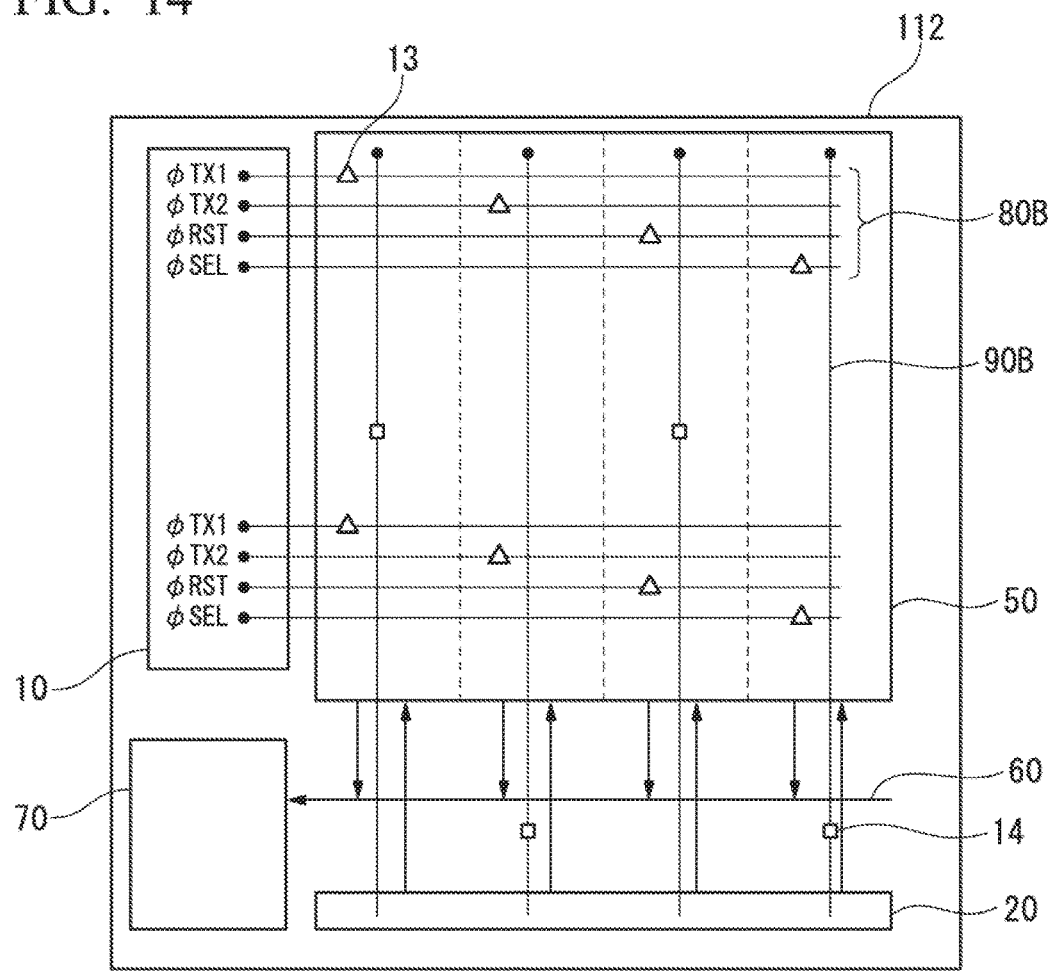
FIG. 14 is a block diagram showing a configuration of a second substrate included in the solid-state imaging device according to the third embodiment of the present invention.

FIG. 14 shows a configuration of the second substrate 112. As shown in FIG. 14, the second substrate 112 includes a vertical readout circuit 10, a horizontal readout circuit 20, a signal processing circuit 50, an output unit 70, a plurality of second control signal lines 80B, and a plurality of second vertical signal lines 90B. The positions of the plurality of control connections 13 and the plurality of readout connections 14 are shown in FIG. 14. The sizes of the plurality of control connections 13 and the plurality of readout connections 14 are not shown in FIG. 14. Although a plurality of control connections 13 are arranged in FIG. 14, a reference numeral of a single control connection 13 is shown as a representative. Although a plurality of readout connections 14 are arranged in FIG. 14, a reference numeral of a single readout connection 14 is shown as a representative. Although a plurality of second control signal lines 80B are arranged in FIG. 14, a reference numeral of four second control signal lines 80B are shown as a representative. Although a plurality of second vertical signal lines 90B are arranged in FIG. 14, a reference numeral of a single second vertical signal line 90B is shown as a representative.

Parts of the configuration shown in FIG. 14 different from the configuration shown in FIG. 11 are described below.

The plurality of second vertical signal lines 90B are arranged in the column direction of the array of the plurality of pixels 40. The plurality of second vertical signal lines 90B are arranged in correspondence with the plurality of first vertical signal lines 90A. Each of the plurality of readout connections 14 is connected to one of the plurality of second vertical signal lines 90B. In FIG. 14, a single readout connection 14 is connected to a single second vertical signal line 90B. As shown in FIGS. 13 and 14, each of the plurality of readout connections 14 is connected to one of the plurality of first vertical signal lines 90A and a corresponding one of the plurality of second vertical signal lines 90B. Two or more readout connections 14 may be connected to one of the plurality of first vertical signal lines 90A and a corresponding one of the plurality of second vertical signal lines 90B.

The plurality of second vertical signal lines 90B are connected to an input portion of the signal processing circuit 50. Pixel signals transferred through the plurality of readout connections 14 are transferred to the input portion of the signal processing circuit 50 through the plurality of second vertical signal lines 90B. Since the signal processing circuit 50 has already been described, a description of the signal processing circuit 50 is omitted.

Parts other than the above of the configuration shown in FIG. 14 are the same as those of the configuration shown in FIG. 11.

The readout connection 14 can be arranged at an arbitrary position between the first vertical signal line 90A and the second vertical signal line 90B. Therefore, as shown in FIGS. 13 and 14, it is possible to dispose a plurality of readout connections 14 such that positions in the column direction of two readout connections 14 corresponding to two adjacent columns in the array of the plurality of pixels 40 are different from each other. This enlarges a region in which the plurality of readout connections 14 can be arranged.

According to the third embodiment, the solid-state imaging device 1B is configured to include the first substrate 102, the second substrate 112, and the connection portion 120. The first substrate 102 has a plurality of pixels 40, a plurality of first control signal lines 80A, and a plurality of first vertical signal lines 90A (first readout signal lines). The second substrate 112 has a plurality of second control signal lines 80B, a vertical readout circuit 10 (a control circuit), and a plurality of second vertical signal lines 90B (second readout signal lines). The connection portion 120 has a plurality of control connections 13 and a plurality of readout connections 14.

In the third embodiment, a plurality of first control signal lines 80A are arranged on the first substrate 102 and a plurality of second control signal lines 80B are arranged on the second substrate 112. Each of the plurality of control connections 13 is connected to one of the plurality of first control signal lines 80A and a corresponding one of the plurality of second control signal lines 80B. This enlarges a region in which the plurality of control connections 13 can be arranged. As a result, the pitch of control connections 13 is increased and therefore it is possible to reduce defects in electrical connection between the two substrates. Thus, the yield is improved.

In the third embodiment, each of the plurality of readout connections 14 is connected to one of the plurality of first vertical signal lines 90A and a corresponding one of the plurality of second vertical signal lines 90B. This enlarges a region in which the plurality of readout connections 14 can be arranged. As a result, the pitch of readout connections 14 is increased and therefore it is possible to reduce defects in electrical connection between the two substrates.

Two or more readout connections 14 may be connected to one of the plurality of first vertical signal lines 90A and a corresponding one of the plurality of second vertical signal lines 90B. The resistance of a pixel signal path between the first substrate 102 and the second substrate 112 is reduced by connecting two or more readout connections 14 to one first vertical signal line 90A and one second vertical signal line 90B. This reduces voltage drop of pixel signals. As a result, deterioration in image quality is reduced.

Fourth Embodiment

Figure 15:
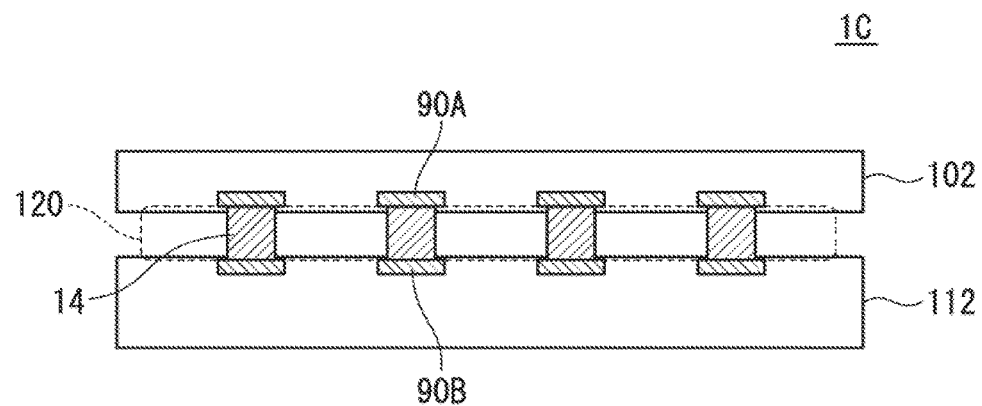
FIG. 15 is a cross-sectional view of a solid-state imaging device according to a fourth embodiment of the present invention.

In a fourth embodiment of the present invention, the solid-state imaging device 1B shown in FIG. 12 is replaced with a solid-state imaging device 1C shown in FIG. 15. FIG. 15 shows a cross-section of the solid-state imaging device 1C. As shown in FIG. 15, the solid-state imaging device 1C includes a first substrate 102, a second substrate 112, and a connection portion 120.

Parts of the configuration shown in FIG. 15 different from the configuration shown in FIG. 12 are described below.

A readout connection 14 in the solid-state imaging device 1C is configured to be thicker than the readout connection 14 in the solid-state imaging device 1B shown in FIG. 12. Therefore, the cross-sectional area of each of a plurality of readout connections 14 is greater than the cross-sectional area of each of the plurality of control connections 13. The cross-sectional area of a readout connection 14 is a cross-sectional area of the readout connection 14 in a plane perpendicular to the lamination direction of the first substrate 102 and the second substrate 112. Similarly, the cross-sectional area of a control connection 13 is a cross-sectional area of the control connection 13 in a plane perpendicular to the lamination direction of the first substrate 102 and the second substrate 112.

Parts other than the above of the configuration shown in FIG. 15 are the same as those of the configuration shown in FIG. 12. A cross-section including a control connection 13 of the solid-state imaging device 1C is the same as the cross-section of the solid-state imaging device 1 shown in FIG. 3.

In the solid-state imaging device 1 shown in FIGS. 3 and 4, the cross-sectional area of each of the plurality of readout connections 14 may be greater than the cross-sectional area of each of the plurality of control connections 13. In the solid-state imaging device 1A shown in FIG. 9, the cross-sectional area of each of the plurality of readout connections 14 may be greater than the cross-sectional area of each of the plurality of control connections 13. In the solid-state imaging device 1B shown in FIG. 12, the cross-sectional area of each of the plurality of readout connections 14 may be greater than the cross-sectional area of each of the plurality of control connections 13.

According to the fourth embodiment, the solid-state imaging device 1C is configured to include the first substrate 102, the second substrate 112, and the connection portion 120. The first substrate 102 has a plurality of pixels 40, a plurality of first control signal lines 80A, and a plurality of first vertical signal lines 90A (first readout signal lines). The second substrate 112 has a plurality of second control signal lines 80B, a vertical readout circuit 10 (a control circuit), and a plurality of second vertical signal lines 90B (second readout signal lines). The connection portion 120 has a plurality of control connections 13 and a plurality of readout connections 14.

In the fourth embodiment, a plurality of first control signal lines 80A are arranged on the first substrate 102 and a plurality of second control signal lines 80B are arranged on the second substrate 112. Each of the plurality of control connections 13 is connected to one of the plurality of first control signal lines 80A and a corresponding one of the plurality of second control signal lines 80B. This enlarges a region in which the plurality of control connections 13 can be arranged. As a result, the pitch of control connections 13 is increased and therefore it is possible to reduce defects in electrical connection between the two substrates. Thus, the yield is improved.

In the fourth embodiment, the cross-sectional area of each of the plurality of readout connections 14 is greater than the cross-sectional area of each of the plurality of control connections 13. This reduces the resistances of the plurality of readout connections 14. As a result, the voltage drop of pixel signals is reduced.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A solid-state imaging device, comprising:
a first substrate;
a second substrate laminated on the first substrate; and
a connection portion disposed between the first substrate and the second substrate;
wherein the first substrate includes:
   a plurality of pixels arranged in a matrix to output pixel signals according to control signals; and
   a plurality of first control signal lines connected to pixels of each row in an array of the plurality of pixels,
wherein the second substrate includes:
   a plurality of second control signal lines arranged in correspondence with the plurality of first control signal lines; and
   a control circuit connected to the plurality of second control signal lines to output the control signals,
wherein an arrangement of each of the plurality of second control signal lines on the second substrate corresponds to an arrangement of a corresponding one of the plurality of first control signal lines on the first substrate,
wherein the connection portion includes:
   a plurality of control connections, each being connected to one of the plurality of first control signal lines and a corresponding one of the plurality of second control signal lines; and
   a plurality of readout connections configured to output the pixel signals output from the plurality of pixels to the second substrate, and
wherein the number of control connections connected to one of the first control signal lines connected to pixels in the same row in the array of the plurality of pixels is smaller than the number of columns in the array of the plurality of pixels.

2. A solid-state imaging device, comprising:
a first substrate;
a second substrate laminated on the first substrate; and
a connection portion disposed between the first substrate and the second substrate;
wherein the first substrate includes:
   a plurality of pixels arranged in a matrix to output pixel signals according to control signals; and
   a plurality of first control signal lines connected to pixels of each row in an array of the plurality of pixels,
wherein the second substrate includes:
   a plurality of second control signal lines arranged in correspondence with the plurality of first control signal lines; and
   a control circuit connected to the plurality of second control signal lines to output the control signals,
wherein an arrangement of each of the plurality of second control signal lines on the second substrate corresponds to an arrangement of a corresponding one of the plurality of first control signal lines on the first substrate,
wherein the connection portion includes:
   a plurality of control connections, each being connected to one of the plurality of first control signal lines and a corresponding one of the plurality of second control signal lines; and
   a plurality of readout connections configured to output the pixel signals output from the plurality of pixels to the second substrate, and
wherein the number of readout connections to which the pixel signals output from pixels of the same column in the array of the plurality of pixels are input is smaller than the number of rows in the array of the plurality of pixels.

3. A solid-state imaging device, comprising:
a first substrate;
a second substrate laminated on the first substrate; and
a connection portion disposed between the first substrate and the second substrate;

wherein the first substrate includes:
- a plurality of pixels arranged in a matrix to output pixel signals according to control signals; and
- a plurality of first control signal lines connected to pixels of each row in an array of the plurality of pixels, wherein the second substrate includes:
- a plurality of second control signal lines arranged in correspondence with the plurality of first control signal lines; and
- a control circuit connected to the plurality of second control signal lines to output the control signals, wherein an arrangement of each of the plurality of second control signal lines on the second substrate corresponds to an arrangement of a corresponding one of the plurality of first control signal lines on the first substrate, wherein the connection portion includes:
- a plurality of control connections, each being connected to one of the plurality of first control signal lines and a corresponding one of the plurality of second control signal lines; and
- a plurality of readout connections configured to output the pixel signals output from the plurality of pixels to the second substrate, and wherein a cross-sectional area of each of the plurality of readout connections is greater than a cross-sectional area of each of the plurality of control connections.

4. A solid-state imaging device, comprising:
a first substrate;
a second substrate laminated on the first substrate; and
a connection portion disposed between the first substrate and the second substrate;

wherein the first substrate includes:
- a plurality of pixels arranged in a matrix to output pixel signals according to control signals; and
- a plurality of first control signal lines connected to pixels of each row in an array of the plurality of pixels, wherein the second substrate includes:
- a plurality of second control signal lines arranged in correspondence with the plurality of first control signal lines; and
- a control circuit connected to the plurality of second control signal lines to output the control signals, wherein an arrangement of each of the plurality of second control signal lines on the second substrate corresponds to an arrangement of a corresponding one of the plurality of first control signal lines on the first substrate, wherein the connection portion includes:
- a plurality of control connections, each being connected to one of the plurality of first control signal lines and a corresponding one of the plurality of second control signal lines; and
- a plurality of readout connections configured to output the pixel signals output from the plurality of pixels to the second substrate, wherein the control circuit is configured to output a plurality of the control signals that are provided to each of the plurality of pixels, and a length of a path of each of the plurality of the control signals from the control circuit to each of the plurality of pixels is different for each of the plurality of the control signals.

* * * * *